United States Patent [19]

Harada et al.

[11] Patent Number: 4,884,126
[45] Date of Patent: Nov. 28, 1989

[54] SEMICONDUCTOR DEVICE HAVING PARALLEL-CONNECTED, SELF TURN-OFF TYPE SEMICONDUCTOR ELEMENTS

[75] Inventors: Eiji Harada, Hitachi; Hitoshi Matsuzaki, Mito; Sigeo Tomita; Katsunori Chida, both of Hitachi, all of Japan

[73] Assignee: Hitachi, Ltd., Tokyo, Japan

[21] Appl. No.: 144,061

[22] Filed: Jan. 15, 1988

Related U.S. Application Data

[63] Continuation of Ser. No. 840,203, Mar. 17, 1986, abandoned.

[30] Foreign Application Priority Data

Mar. 23, 1985 [JP] Japan .................................. 60-58951

[51] Int. Cl.[4] ..................... H01L 23/34; H01L 23/48; H01L 25/02
[52] U.S. Cl. .......................... 357/81; 357/75; 357/68
[58] Field of Search ............... 357/81, 31, 75, 74, 357/68

[56] References Cited

U.S. PATENT DOCUMENTS

| | | |
|---|---|---|
| 4,107,728 | 8/1978 | Max . |
| 4,172,261 | 10/1979 | Tsuzuki et al. ................. 357/81 |
| 4,193,083 | 3/1980 | Max . |
| 4,246,596 | 1/1981 | Iwasaki ................... 357/81 |
| 4,394,530 | 7/1983 | Kaufman . |
| 4,488,167 | 12/1984 | Neidig et al. . |
| 4,516,149 | 5/1985 | Wakui et al. ................. 357/71 |
| 4,639,759 | 1/1987 | Neidig et al. . |

FOREIGN PATENT DOCUMENTS

| | | |
|---|---|---|
| 2800304 | 7/1978 | Fed. Rep. of Germany . |
| 3217345 | 12/1982 | Fed. Rep. of Germany . |
| 3127456 | 2/1983 | Fed. Rep. of Germany . |
| 2840514 | 7/1983 | Fed. Rep. of Germany . |
| 3201296 | 7/1983 | Fed. Rep. of Germany . |
| 3336979 | 4/1984 | Fed. Rep. of Germany . |
| 3241509 | 5/1984 | Fed. Rep. of Germany . |
| 254757 | 12/1985 | Japan ..................... 357/81 |

*Primary Examiner*—Rolf Hille
*Assistant Examiner*—S. V. Clark
*Attorney, Agent, or Firm*—Antonelli, Terry & Wands

[57] ABSTRACT

A semiconductor device is disclosed in which at least two semiconductor elements each having a self turn-off function are disposed in a package and connected in paralllel, and in which the semiconductor elements, terminals mounted on the package, and internal wirings for connecting the semiconductor elements to the terminals are arranged in geometrical symmetry, to eliminate the imbalance of current between the semiconductor elements.

4 Claims, 3 Drawing Sheets

FIG. IA
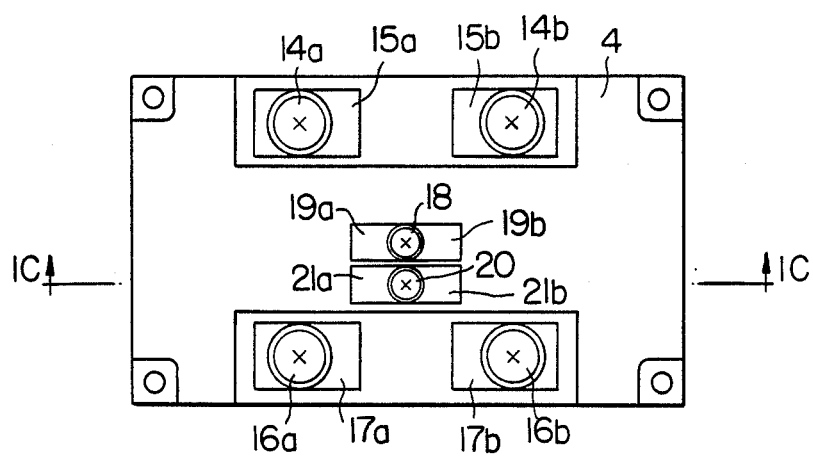
FIG. IB
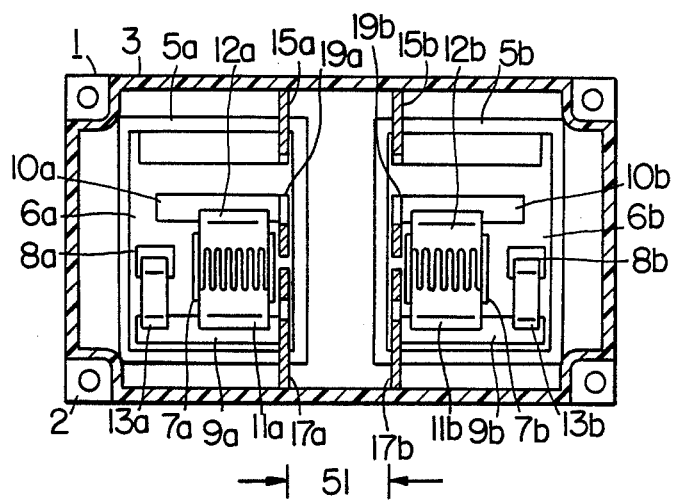

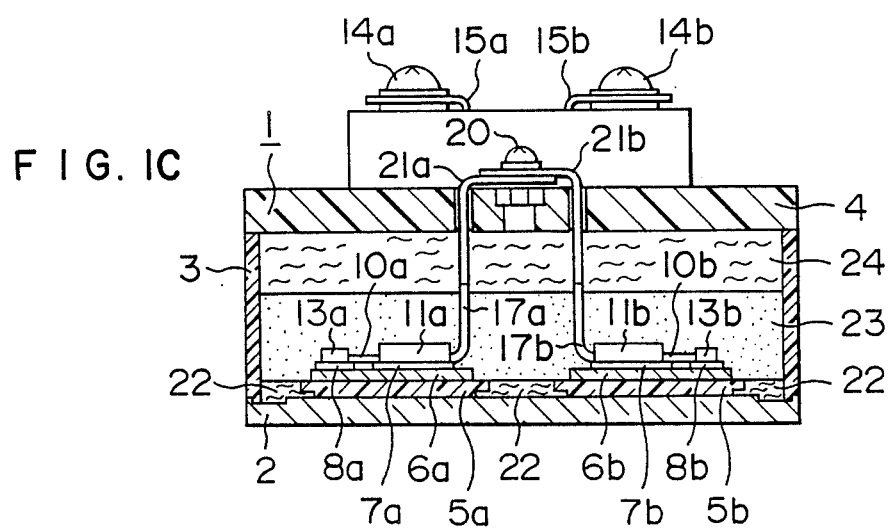

SEMICONDUCTOR DEVICE HAVING PARALLEL-CONNECTED, SELF TURN-OFF TYPE SEMICONDUCTOR ELEMENTS

This application is a continuation of application Ser. No. 840,203 filed Mar. 17, 1986 now abandoned.

BACKGROUND OF THE INVENTION

The present invention relates to a semiconductor device, and more particularly to a module in which at least two semiconductor elements each having a self turn-off function, such as gate turn-off thyristors having a self turn-off function (hereinafter referred to as "GTO's") and transistors are connected in parallel within a package. The above semiconductor element will hereinafter be referred to as "chip".

In a conventional semiconductor device which is disclosed in Japanese Patent Application unexamined publication No. 59-110,146 and in which two chips are connected in parallel within a package, the chips have the same characteristics, the control terminals of the chips are connected directly to each other, and only the chips are made symmetrical with respect to a specified plane within the package. When the semiconductor device performs a high-speed operation, for example, is rapidly turned on, the current flowing through one of the chips is greatly different from the current flowing through the other chip. Such imbalance of current may cause either one of the chips to be damaged. In order to avoid damage to the chip, it is necessary to decrease the rated current of the semiconductor device. Thus, the parallel connection of the chips will reduce the efficiency of the semiconductor device.

In the conventional semiconductor device, the wiring for connecting the chips in parallel within the package has a reactance of about $10^{-9}$ H and a resistance of about $10^{-6}$ Ω. Such reactance and resistance are negligibly small. Accordingly, the internal wiring for connecting the chips to external terminals which are mounted on the package, is formed in accordance with the positions of the chips in the package and the arrangement of the external terminals, without paying any special attention to the arrangement of the internal wiring.

In recent years, such a semiconductor device is required to perform a high-speed operation, and specifically it is required to turn on or turn off the semiconductor device in a time of the order of microseconds. The inventors have found through experiments that the impedance of internal wiring which has hitherto been neglected, is a very important problem in such a situation.

Now, let us consider a case where two GTO chips are connected in parallel within a package and the difference in ON-voltage between the GTO chips is equal to or less than 0.2 V, by way of example. When the GTO chips are turned on and turned off, the imbalance rate of current at the turn-on time, that is, the ratio of the difference between the turn-on current flowing through one of the GTO chips and the turn-on current flowing through the other GTO chip to the sum of these turn-on currents lies within a range from 0% to 38%. Further, the imbalance rate of current in the stationary ON-state lies within a range from 0% to 5%, and the imbalance rate of current at the turn-off time lies within a range from 0% to 30%.

SUMMARY OF THE INVENTION

An object of the present invention is to provide a semiconductor device in which at least two chips each having a self turn-off function are connected in parallel within a package, and can be operated without producing the imbalance of current, being damaged, or reducing the effect of the parallel connection.

In order to attain the above object, according to one feature of the present invention, there is provided a semiconductor device in which parallel-connected chips are arranged symmetrically in a geometrical sense, together with external terminals and internal wirings for connecting the chips to the external terminals.

The present invention is based upon the concept that the imbalance of current at a transient time or in a stationary state is caused by the difference in impedance of wiring between one chip side and the other chip side, that is, the difference between the counter electromotive force due to the reactance and resistance of internal wiring associated with one chip and the counter electromotive force due to the reactance and resistance of internal wiring associated with the other chip. Further, it was verified by the inventors' experiments that when the internal wiring was controlled so that the difference in impedance of wiring between the two sides was made substantially equal to zero, the imbalance rate of current was made less than 5% at the turn-off time, in the stationary ON-state, and at the turn-off time. In order to eliminate the difference in impedance of wiring between the two sides, according to the present invention, the chips are arranged symmetrically together with the terminals and the internal wiring.

BRIEF DESCRIPTION OF THE DRAWINGS

FIG. 1A is a view of an embodiment of a GTO module according to the present invention on the upper side of the embodiment.

FIG. 1B is view like that shown in FIG. 1A, but with the upper side of the GTO module cut away.

FIG. 1C is a sectional view taken along the line IC—IC of FIG. 1A.

DESCRIPTION OF THE PREFERRED EMBODIMENT

Figure 2A:
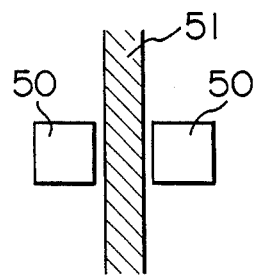
FIG. 2A is a schematic view showing a case where two GTO chips are arranged symmetrically with respect to a plane in accordance with the present invention.

Now, the present invention will be explained, on the basis of an embodiment thereof.

FIG. 1A is a plan view of the upper side of an embodiment of a GTO module according to the present invention, in which embodiment an antiparallel connection of a GTO chip and a diode chip and an anti-parallel connection of another GTO chip and another diode chip are connected in parallel within a package, and FIG. 1B is a similar view with the upper side cut away, and FIG. 1C is a sectional view taken along the line 1C—1C of FIG. 1A. In FIGS. 1A, 1B, and 1C, a suffix a designates parts concerned with one of the GTO chips, and a suffix b designates parts concerned with the other GTO chip. It is to be noted that some parts appearing in the following explanation may not be designated by reference numerals in FIGS. 1A and 1B.

Referring to FIGS. 1A, 1B, and 1C a box-shaped package 1 is made up of a cooling fin 2 which is made of a metal, an insulating side case 3 provided on one principal surface of the cooling fin 2, and an insulating, covering case (namely, an insulating lid) 4 provided on the side case 3 so that the side case 3 is interposed between the cooling fin 2 and the covering case 4. The members 2, 3 and 4 are bonded to one another by an adhesive agent. Anode electrode plates 6a and 6b are fixed to the cooling fin 2 through insulators 5a and 5b, respectively. Each of the insulators 5a and 5b is a laminate and is formed such that an intermediate plate made of copper is sandwiched between insulating layers. However, the detailed structure of each of the insulators 5a and 5b is not shown in FIG. 1B for the sake of brevity. A GTO chip 7a and a diode chip a are fixed to the surface of the anode electrode plate 6a so that the GTO chip 7a is opposite in rectifying direction to the diode chip 8a, and a GTO chip 7b and a diode chip 8b are fixed to the surface of the anode electrode plate 6b so that the GTO chip 7b is opposite in rectifying direction to the diode chip 8b. In other words, the anode side of the GTO chip 7a and the cathode side of the diode chip 8a are bonded to the anode electrode plate 6a, and the anode side of the GTO chip 7b and the cathode side of the diode chip 8b are bonded to the anode electrode plate 6b. A cathode electrode plate 9a and a gate electrode plate 10a are fixed to the anode electrode plate 6a through insulators (not shown), and a cathode electrode plate 9b and a gate electrode plate 10b are fixed to the anode electrode plate 6b through insulators (not shown).

In each of the GTO chips 7a and 7b, the emitter layer on the cathode side is divided into a plurality of stripe-shaped regions, which are exposed to the upper principal surface of the GTO chip together with the base layer on the cathode side and are surrounded by the base layer. A cathode electrode film and a base electrode film are formed, by evaporation, on the stripe-shaped emitter regions and the base layer, respectively, and the exposed area of the upper principal surface of the GTO chip is coated with an insulating surface passivation film such as a silicon oxide film. The cathode electrode film is connected to the cathode electrode plate 9a or 9b through a cathode electrode member 11a or 11b having a comb-shaped fine pattern, and the gate electrode film is connected to the gate electrode plate 10a or 10b through a gate electrode member 12a or 12b having another comb-shaped fine pattern. Details of the cathode electrode members 11a and 11b and the gate electrode members 12a and 12b are explained in U.S. Pat. No. 4,516,149. The anode side of the diode chip 8a is connected to the cathode electrode plate 9a through an electrode member 13a, and the anode side of the diode chip 8b is connected to the cathode electrode plate 9b through an electrode member 13b. Anode terminals 15a and 15b are engaged with external screws 14a and 14b mounted on the covering case 4, respectively, and are extended so as to be fixed to the anode electrode plates 6a and 6b, respectively. Similarly, cathode terminals 17a and 17b are engaged with external screws 16a and 16b, respectively, and are extended so as to be fixed to the cathode electrode plates 9a and 9b, respectively. Gate terminals 19a and 19b are kept in contact with an external screw 18, and are fixed to the gate electrode plates 10a and 10b, respectively.

Other external cathode terminals for gating 21a and 21b are engaged with an external screw 20. The cathode terminals 21a and 17a are united in one body within the package 1, and the cathode terminals 21b and 17b are united in one body within the package 1. As explained above, in the present embodiment, similar members indicated by the suffices a and b and corresponding to the GTO chips 7a and 7b are provided in the package 1, and are disposed symmetrically as will be explained later. That is, the package is formed of a plurality of units, the number of which is equal to the number of GTO chips.

A hard resin 22 is introduced into the inside space of the package 1 to the upper surfaces of the insulators 5a and 5b, and then hardened. Thereafter, a soft resin 23 and a hard resin 24 are successively introduced into the inside space of the package 1, and then hardened. These resins are omitted from FIG. 1A for simplicity's sake.

In a case where an inverter is formed of the present embodiment, the anode terminals 15a and 15b are connected to each other by an external connecting bar which is connected between the screws 14a and 14b, and the external cathode terminals 17a and 17b are connected to each other by another connecting bar (external bus bar) which is connected between the screws 16a and 16b. Thus, the GTO chips 7a and 7b are in parallel connection.

In the present embodiment, not only the terminals but also the internal wiring extending from the terminals to the GTO chips 7a and 7b and the diode chips 8a and 8b is arranged symmetrically with respect to a plane passing through the middle between the GTO chips 7a and 7b, and members used for the GTO chip 7a are made equal in dimensions and material to members used for the GTO chip 7b. Accordingly, the impedance of the internal wiring concerned with the GTO chip 7a is equal to that of the internal wiring concerned with the GTO chip 7b. Therefore, in a case where an external anode lead is connected to a selected one of the screws 14a and 14b and an external cathode lead is connected to a selected one of the screws 16a and 16b, if the external bus bar between the screws 14a and 14b and the external bus bar between the screws 16a and 16b are made sufficiently large in width and thickness, the impedance of the wiring from the selected screws to the GTO chip 7a will be substantially equal to the impedance of the wiring from the selected screws to the GTO chip 7b, since the impedance of each bus bar is negligibly small. Thus, the imbalance of current will not occur.

The present embodiment showing symmetry about the above-mentioned plane was actually turned on and off in a time of the order of microseconds. In this case, the imbalance rate of current is within a range from 0% to 5% at the turn-on time, in the ON-state, and at the turn-off time. Moreover, the GTO chips 7a and 7b were operated without being damaged and reducing the effect of the parallel combination.

The present inventors found the following facts through experiments. The imbalance of current in the ON-state is caused mainly by the difference in ON-state resistance between the GTO chips 7a and 7b, the imbalance of current at the turn-off time is caused by the difference in the reactance of the so-called gate wiring which is extended from the gate terminal to the external cathode terminal through the GTO chip, between the chip-7a side and the chip-7b side, and the imbalance of current at the turn-on time is caused by the difference in the reactance of the so-called cathode wiring which is extended from the cathode terminal to the cathode of the GTO, between the chip-7a side and the chip-7b side. In order to make the imbalance rate of current less than 5%, it is desirable to use a geometrically symmetric arrangement. In some cases, the imbalance rate of current may exceed 5% for various reasons, notwithstanding that a symmetric arrangement is achieved. To solve the problems a measure for relaxing the symmetry only a little to suppress the imbalance rate of current below 5% will be explained below.

Now, let us consider a case where a lead having a cross sectional area of 10 mm$^2$ is used. The lead having a length of 1 cm corresponds to a reactance of 7 nH. The imbalance rate of current at the turn-on time is 1% when the difference in the reactance of the cathode wiring between the chip-7a side and the chip-7b side is equal to 0.8 nH, and the imbalance rate of current at the turn-off time is 1% when the difference in the reactance of the gate wiring between the chip-7a side and the chip-7b side is equal to 2 nH. Accordingly, when the imbalance of current occurs at the turn-on time or the turn-off time, the following processing is carried out. That is, the length of the cathode wiring or gate wiring is adjusted within a permissible range while keeping the positions of the terminals as they are, since it is undesirable from the viewpoint of mass-productivity to change the positions of terminals. The position of at least one GTO chip is changed only a little in accordance with the cathode or gate wiring which has been adjusted. Thus, the imbalance rate of current can be made less than 5%.

FIGS. 2A to 2D show cases where two, three, four and six GTO chips 50 are arranged symmetrically with respect to a terminal mounting member or region 51. When diode chips and internal wiring are arranged symmetrically together with the GTO chips 50 of each of FIGS. 2A to 2D, the imbalance of current can be substantially eliminated.

Figure 2B:
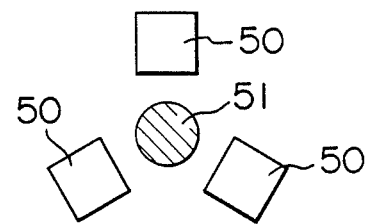
FIG. 2B is a schematic view showing a case where three GTO chips are arranged symmetrically around an axis in accordance with the present invention.
Figure 2C:
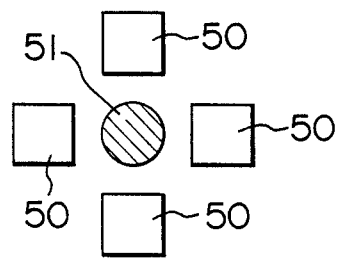
FIG. 2C is a schematic view showing a case where four GTO chips are arranged symmetrically around an axis in accordance with the present invention.
Figure 2D:
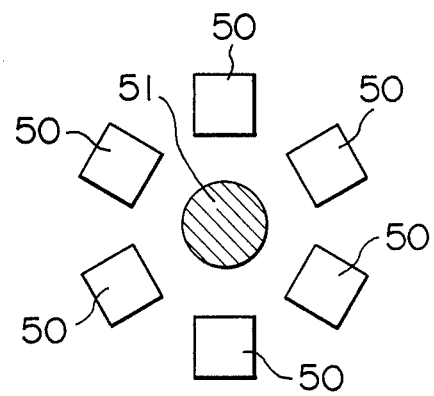
FIG. 2D is a schematic view showing a case where six GTO chips are arranged symmetrically around an axis in accordance with the present invention.

In the arrangement of FIG. 2A, cathode terminals, gate terminals and anode terminals can be mounted in the mounting region 51 along the lengthwise direction thereof in a desired order. That is, these terminals may be mounted in the order of the cathode terminals, the gate terminals and the anode terminals, in the order of the cathode terminals, the anode terminals and the gate terminals, or in the order of the anode terminals, the cathode terminals and the gate terminals. In the arrangements of FIGS. 2B to 2D, anode terminals are mounted in the mounting region 51 along the periphery thereof, and gate terminals and cathode terminals are mounted in a similar manner.

Although diode chips accompanying the GTO chips are not shown in FIGS. 2A to 2D, the diode chips are arranged in such a manner that two diode chips connected to two adjacent GTO chips as each group are symmetrical with respect to a symmetry plane of the two adjacent GTO chips.

Although the embodiments in which GTO chips are included in a package have been explained, the GTO chips may be replaced by transistor chips, where the anode, gate and cathode of a GTO chip may be replaced by the collector, base and emitter of a transistor chip, respectively.

When passive elements, such as a resistor and a capacitor are included in each GTO or transistor chip, GTO chips or transistor chips are arranged so that passive elements included in two adjacent GTO or transistor chips and internal wiring associated with the passive elements are also symmetrical with respect to symmetry plane of the two adjacent chips.

As has been described above, according to the present invention, there is provided a semiconductor device in which the parallel connection of a plurality of chips each having a self turn-off function can be formed without producing imbalance of current, damaging the chips, and reducing the efficiency of the parallel connection.

We claim:

1. A semiconductor device having parallel-connected, self turn-off semiconductor elements, comprising:
   (a) a package for packaging self turn-off type semiconductor elements, said package including a metallic cooling fin, an insulating side case provided on one principal surface of said cooling fin, and an insulating covering case disposed on said side case;
   (b) a plurality of self turn-off type semiconductor elements each having a semiconductor chip having predetermined pn junctions therein and three electrodes in ohmic contact with said semiconductor chip, and mounted on said cooling fin of said package through an insulating material; and
   (c) a plurality of terminals mounted on said insulating covering case, each having one end disposed internally of said package and electrically connected with a respective electrode of a corresponding one of said plurality of self turn-off type elements, and the other end exposed externally of said package through said insulating covering case; and
   at least one of said plurality of terminals electrically connected with respective ones of said plurality of self turn-off semiconductor elements being mounted on a common terminal mount region of said insulating covering case, and said plurality of self turn-off semiconductor elements being disposed symmetrically with respect to said common terminal mount region.

2. A semiconductor device according to claim 1, wherein each of said self turn-off type semiconductor elements is one of a gate turn-off thyristor and a transistor.

3. A semiconductor device according to claim 1, wherein all of said plurality of terminals are mounted in said common mount region.

4. A semiconductor device according to claim 1, wherein each of said plurality of self turn-off semiconductor elements are one of a gate turn-off thyristor and a transistor.

* * * * *